United States Patent [19]
Hatano et al.

[11] Patent Number: 5,963,834
[45] Date of Patent: Oct. 5, 1999

[54] METHOD FOR FORMING A CVD FILM

[75] Inventors: Tatsuo Hatano; Seishi Murakami, both of Yamanashi-ken; Keishi Akiba, Kofu; Takaya Shimizu, Nirasaki, all of Japan

[73] Assignee: Tokyo Electron Limited, Tokyo, Japan

[21] Appl. No.: 08/992,178

[22] Filed: Dec. 17, 1997

[30] Foreign Application Priority Data

Dec. 20, 1996 [JP] Japan .................................. 8-354603

[51] Int. Cl.$^6$ .................................................. H01L 21/44
[52] U.S. Cl. ........................... 438/680; 438/685; 438/905
[58] Field of Search ................................. 438/680, 685, 438/905

[56] References Cited

U.S. PATENT DOCUMENTS 5,326,723  7/1994  Petro et al. .
5,709,757  1/1998  Hatano et al. .
5,785,796  7/1998  Lee .

FOREIGN PATENT DOCUMENTS 6-037074  2/1994  Japan .
8-115886  5/1996  Japan .

*Primary Examiner*—John F. Niebling
*Assistant Examiner*—Josetta Jones
*Attorney, Agent, or Firm*—Oblon, Spivak, McClelland, Maier & Neustadt, P.C.

[57] ABSTRACT

A method for forming a CVD film, comprising the steps of loading at least one object to be processed into a processing chamber and positioning the object on a support base in the processing chamber, after positioning the object in the processing chamber, introducing a process gas from a corresponding gas supply source via a corresponding gas introducing pipe into the processing chamber and forming a film by a chemical vapor deposition method on the object in the processing chamber, after forming the film on the object, unloading the object from the processing chamber, after unloading the object from the processing chamber, dry-cleaning an inside of the processing chamber, and after dry-cleaning the inside of the processing chamber, introducing an inert gas via a corresponding gas introducing pipe into the chamber to purge those particles deposited as a residue in the gas introducing pipe and inside of the chamber.

15 Claims, 3 Drawing Sheets

METHOD FOR FORMING A CVD FILM

BACKGROUND OF THE INVENTION

The present invention relates to a method for forming a film by a CVD (Chemical Vapor Deposition) method on a surface of an object to be processed.

In a film forming process of a semiconductor device, a metal-type thin film is deposited on the surface of a semiconductor wafer to provide a layer structure including a wiring layer, etc. In order to achieve an electrical connection between the wiring layer and the device or between such wiring layers, a contact hole between the device and the wiring layer is filled with a deposited thin film or a via hole between such wiring layers is filled with a deposited thin film. In the case where the via hole is filled with a tungsten film for instance, if any direct contact occurs between the tungsten and such a wiring layer of, for example, aluminum, there occur a greater contact resistance and poor contact between the wiring layers resulting from a migration effect. In order to avoid such an inconvenience, barrier metal (barrier layer) composed of, for example, a Ti film or TiN film is formed on the inner wall surface and bottom surface of the via hole before the via hole is filled with the tungsten film.

Conventionally, such metal type thin film was formed by a PVD (Physical Vapor Deposition) method. Since a design rule becomes stricter with a recent miniaturization and high integration density of a semiconductor device, a line width and hole's opening size become correspondingly smaller and smaller and the aspect ratio becomes outstandingly higher. As a result, it has been difficult to form a desired film by the PVD method. It has also been very difficult to form such a barrier layer, by the PVD method, on the inner surface of a via hole of a small opening size in particular.

In recent years, it has been a practice to form a barrier layer by a CVD method. In the case where the Ti film is deposited by the CVD method in the via hole to provide a barrier layer, $TiCl_4$ (titanium tetracheoride) and $H_2$ (hydrogen) are used as a reaction gas. Further, in the case where the TiN film is deposited by the CVD method in the via hole, the $TiCl_4$ and $NH_3$ (ammonium) or an MMH (monomethylhydrazine) are used as a reaction gas.

In the case where a thin film is deposited by the CVD method on a semiconductor wafer in a processing chamber, it is deposited also on a susceptor, on the inner wall, etc., of the processing chamber. After completing the formation of a film but before forming the next film, cleaning is carried out. As the method for effecting cleaning in the processing chamber, use is usually made of a dry cleaning method. In the dry cleaning method, for example, the inside of the processing chamber and susceptor are heated and, at the same time, a $ClF_3$ gas is introduced into the chamber to decompose a deposited thin film (hereinafter referred to as a deposit). Or an $NF_3$, $SF_6$, $C_2F_6$, or etc., gas is introduced into the chamber and, by using these, a plasma is created to decompose the deposit. Or the deposit is removed mechanically.

In the case where such dry-cleaning is effected in the processing chamber, particles are increasingly deposited as a cleaning residue in the chamber due to the suction of the residue in the gas supply pipe. Therefore, if the next film is formed after heating the susceptor up to a film forming temperature immediately following the dry-cleaning step, the particles are deposited on the semiconductor wafer, thus failing to achieve formation of a desired film. In the prior art technique, therefore, after the dry-cleaning step but before the next film forming step, a film is formed on a plurality of (for example, 5) dummy wafers. That is, such dummy wafers are used so as to avoid an adverse effect by the particles resulting from the cleaning residue. In this method, however, such dummy wafers are used and there is a rise in cost by that extent. Further, it takes an additional time for forming a film on the dummy wafers, so that the throughput is lowered.

BRIEF SUMMARY OF THE INVENTION

It is accordingly the object of the present invention to provide a method for forming a film by a CVD method without needing any additional step using dummy wafers following a step of cleaning the inside of a processing chamber.

In order to achieve the above-mentioned object of the present invention, there is provided a method for forming a CVD film, comprising the steps of:

loading at least one object to be processed into a processing chamber and positioning the object on a support base in the processing chamber;

after positioning the object in the processing chamber, introducing a process gas from a corresponding gas supply source via a corresponding gas introducing pipe into the processing chamber and forming a film by a chemical vapor deposition method on the object in the processing chamber;

after forming the film on the object, unloading the object from the processing chamber;

after unloading the object from the processing chamber, dry-cleaning an inside of the processing chamber; and after dry-cleaning the inside of the processing chamber, introducing an inert gas via a corresponding gas introducing pipe into the chamber to purge those particles deposited as a residue in the gas introducing pipe and inside of the chamber.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

An embodiment of the present invention will be explained below with reference to the accompanying drawing.

Figure 1:
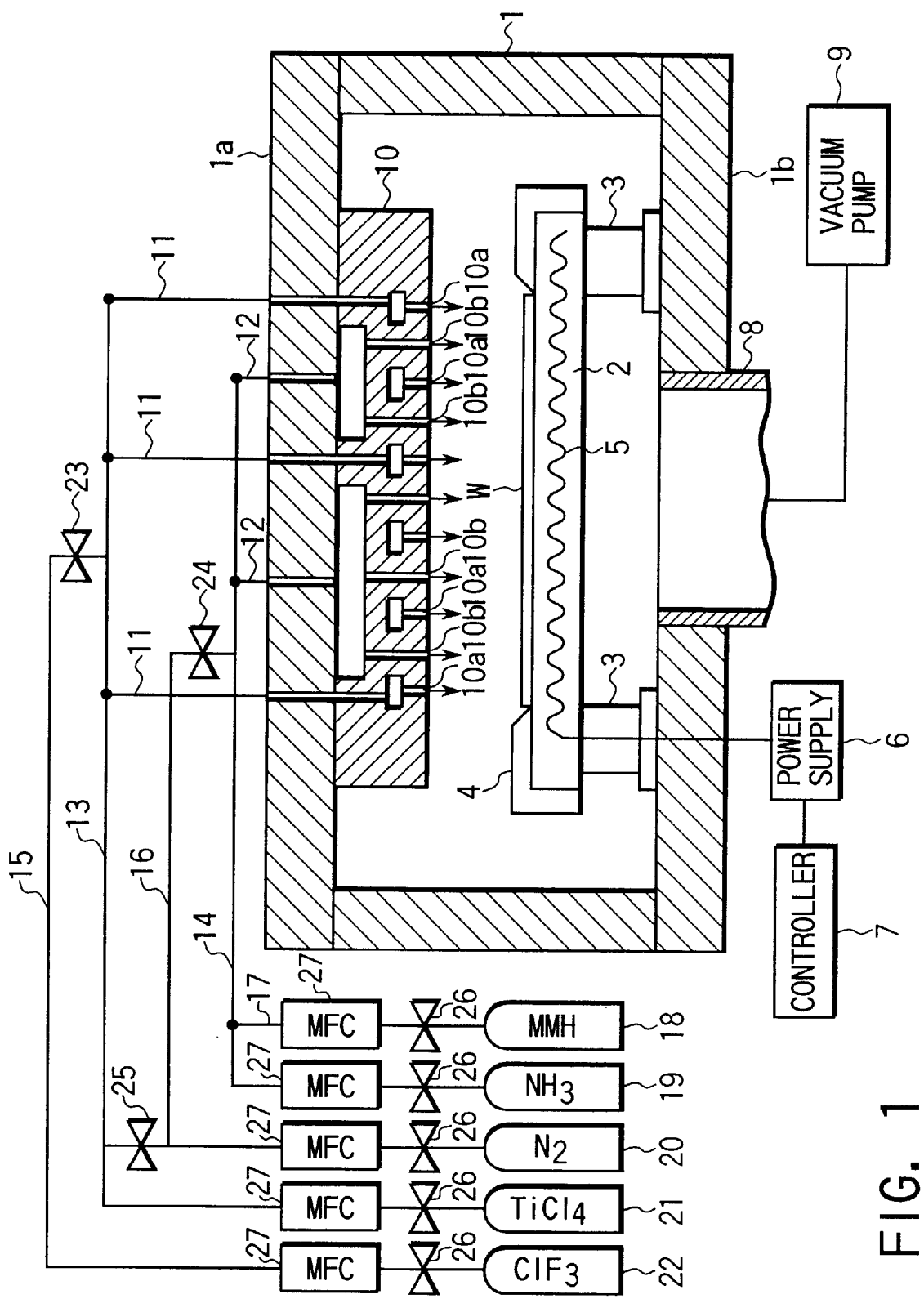
FIG. 1 is a cross-sectional view showing a TiN film forming apparatus for carrying out a CVD film forming method in accordance with one aspect of the present invention.

FIG. 1 shows a TiN forming apparatus for carrying out a method for forming a CVD film in accordance with the present invention. The film forming apparatus has a substantially cylindrical processing chamber 1 with its inner space kept in a hermetically sealed state. A susceptor 2 is located in a processing chamber 1 so as to horizontally support a semiconductor wafer W as an object to be processed. The susceptor 2 is supported by a cylindrical support member 3 and a guide ring 4 is provided at the outer edge of the susceptor 2 to place the semiconductor wafer W in place. A heater 5 is buried in the susceptor 2 and electrically connected to a power supply 6. Upon receiving power from the power supply 6, heater 5 generates heat to heat the semiconductor wafer W on the susceptor 2 to a predetermined temperature. In order to control the power supply to the heater 5, a controller 7 is connected to the power supply 6 and controls an output of the power supply 6 on the basis of information from a temperature sensor, not shown, for detecting the temperature of the susceptor 2 for instance.

A shower head 10 is mounted at a ceiling section 1a of the processing chamber 1 and has a plurality of first and second gas discharge holes 10a, 10b. In this case, the first and second gas discharge holes 10a and 10b are alternately formed along a longitudinal direction of the shower head 10. To the first gas discharge holes 1a, $TiCl_4$ gas source 21 filled with a $TiCl_4$ gas is connected through a gas introducing pipe 13 and its branch pipes 11. To the second gas discharge hole 10b, an $NH_3$ gas source 19 filled with an $NH_3$ gas is connected through a gas introducing pipe 14 and its branch pipes 12. According to the present invention, a postmixing method is adopted by which the shower head 10 of a matrix type is used to allow the $TiCl_4$ and $NH_3$ reaction gases to be discharged in mixed form from the alternately arranged different discharge holes 10a, 10b.

A pipe 15 is connected via a valve 23 to the gas introducing pipe 13. To the pipe 15 is connected a $ClF_3$ gas source 22 filled with a $ClF_3$ gas serving as a cleaning gas. With the valve 23 opened, the $ClF_3$ gas (cleaning gas) is supplied via the gas introducing pipe 13 and branch pipes 11 into the chamber 1 from the first gas discharge holes 10a.

A pipe 16 is connected to the gas introducing pipe 14 via a valve 24 and to an $N_2$ gas source 20 filled with an $N_2$ gas. With the valve 24 opened, the $N_2$ gas is supplied via the gas introducing pipe 14 and its branch pipes 12 into the chamber 1 from the second gas discharge holes 10b. A pipe 16 is connected via a valve 25 also to the gas introducing pipe 13.

An MMH (Monomethylhydrazine) gas source 18 filled with an MMH gas is connected by a pipe 17 to the gas introducing pipe 14 so as to allow the MMH gas to be fed through the gas introducing pipe 14 and its branch pipes 12 into the chamber 1 from the gas discharge holes 10b. Valves 26 and mass flow controller 27 are provided on the pipes 13 to 17 extending from the respective gas sources 18 to 22.

An exhaust pipe 8 is connected to a bottom section 1b of the chamber 1. A vacuum pump 9 is interposed at the exhaust pipe 8 so as to allow the inside of the chamber 1 to be evacuated to a predetermined vacuum level.

New explanation will be given below about the case of forming a TiN film on the semiconductor wafer W with the use of the film forming apparatus.

First, the semiconductor wafer W is loaded into the chamber 1 and heated by the heater 5 to a temperature of, for example, 450 to 600° C. In this case, the inside of the chamber 1 is evacuated by the vacuum pump 9 to a predetermined vacuum level (for example, 1 to 10 Torrs) and the $N_2$ and $NH_3$ gases are introduced into the chamber 1 at a predetermined flow rate (for example, $N_2$ gas: 50 to 500 SCCM; and $NH_3$ gas: 200 to 400 SCCM) and pre-annealing is effected there.

The $TiCl_4$ gas is flowed through the chamber 1 at a predetermined flow rate (for example, 5 to 20 SCCM) and a vacuum level of, for example, 0.1 to 1 Torr, while maintaining the flow rate of the $N_2$ and $NH_3$ gas as set out above, and, in this way, pre-flowing is effected for about 5 to 20 seconds. After such pre-flowing, a TiN film is formed on the semiconductor wafer W, for a predetermined time period, sequentially under the same pre-flowing conditions as set out above. Thereafter, after-annealing is effected in an $NH_3$ gas atmosphere and such a film forming process is completed.

It is preferred that, for example, the $N_2$ gas be flowed, as a purging gas, at a predetermined flow rate, through the chamber 1 during a period from its loading to the completion of a film forming process. It may be possible to use both the $NH_3$ gas and MMH gas during a film formation.

After completing the film formation, a resultant semiconductor wafer W is unloaded out of the chamber 1 and cleaning is effected in the chamber 1 so as to remove a TiN film deposited on the inner wall and susceptor 2 in the chamber 1. In the cleaning step, the supply of the $TiCl_4$ and $NH_3$ gases for film formation is stopped and the valve 23 is opened. Thus the $ClF_3$ gas from the $ClF_3$ gas source 22 is fed via the pipe 15, pipe 13 and branch pipes 11 into the chamber 1 from the first gas discharge holes 10a. At this time, the susceptor 2 and chamber's inner wall are heated to, for example, about 300° C. by both the heater 5 embedded in the susceptor 2 and a heater, not shown, provided in the chamber 1. Since the $ClF_3$ gas is high in reactive nature, the susceptor 2 and chamber's inner wall 1 are heated simply to about 300° C. and, through a reaction of TiN with the $ClF_3$ gas, a titanium fluoride gas is produced. The titanium fluoride is readily exhausted out of the chamber 1 via the exhaust pipe 8. That is, by using the $ClF_3$ gas as the cleaning gas it is possible to effect plasmaless cleaning and hence to very readily clean the inside of the processing chamber 1.

Figure 2:
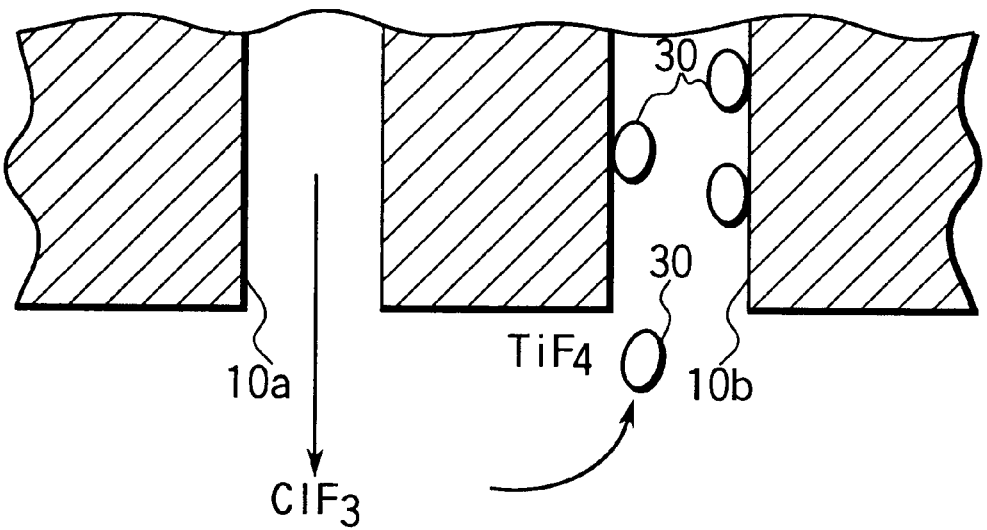
FIG. 2 is a cross-sectional view showing a state in which a cleaning gas is discharged form a shower head in the TiN film forming apparatus in FIG. 1.
Figure 3:
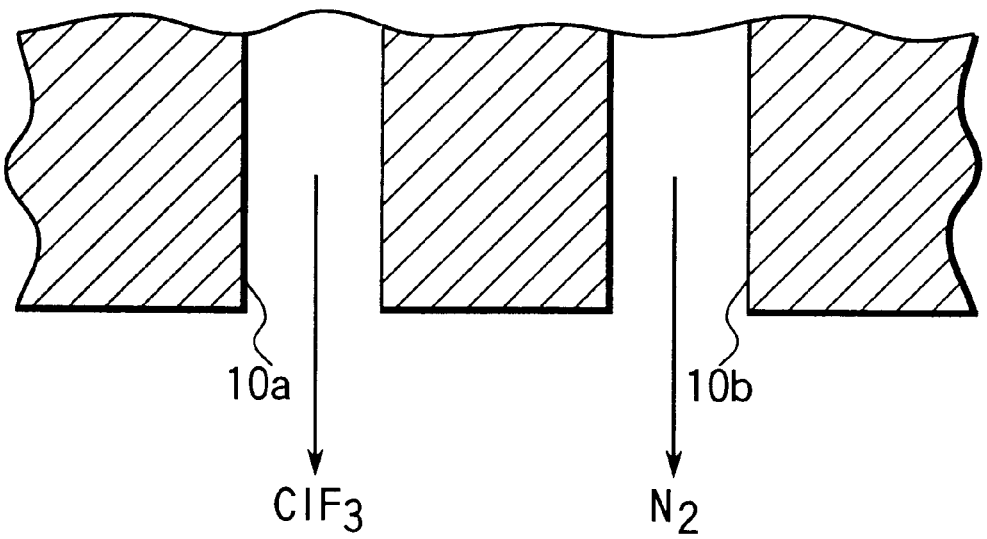
FIG. 3 is a cross-sectional view showing a state in which a cleaning gas and purging gas are discharged from the shower head in the TiN film forming apparatus in FIG. 1.

If the $ClF_3$ gas is exhausted from the first gas discharge holes 10a alone and no gas is exhausted from the second gas discharge holes 10b, then a cleaning residue 30, such as $TiF_4$, is deposited on the inner wall of the second gas discharge holes 10b as shown in FIG. 2. If the cleaning residue 30 is so deposited on the inner walls of the gas discharge holes 10b, then at the next film formation time it is separated as particles from the wall surface of the gas discharge holes 10b. According to the present invention, therefore, at a time when the $ClF_3$ gas is discharged from the first gas discharge holes 10a, the valve 24 is opened and an $N_2$ gas, serving as a purging gas, is exhausted from the second gas discharge holes 10b, as shown in FIG. 3, so that the cleaning residue 30 is prevented from being deposited on the inner walls of the second gas discharge holes 10b.

After the completion of the cleaning process, the susceptor 2 is heated up for the next film formation process. During the heating-up process, the $N_2$ gas is supplied as a purging gas into the chamber 1. In this case, it is preferable that the $N_2$ gas be supplied from both the first and second gas discharge holes 10a and 10b with the two valves 24 and 25 opened. When the purging gas ($N_2$ gas) is thus flowed via the associated pipe into the chamber 1, the cleaning residue left in the associated pipe and in the chamber 1 is purged quickly out of the exhaust pipe 8. In the subsequent film forming process, therefore, those particles formed due to the cleaning residue are markedly decreased, thus eliminating the need for performing a film formation on a dummy wafer as done on the prior art technique.

When the susceptor 2 is heated to a film formation temperature, the supply of the purging gas ($N_2$ gas) into the chamber 1 is stopped and an unprocessed semiconductor wafer W is loaded into the chamber 1 for the next film formation to be performed. In this case it is preferably that, in advance of loading a wafer W into the chamber 1, the susceptor 2 be pre-coated. Here, the "pre-coating" is intended to mean that a film is formed on the susceptor 2 under the same conditions as in the case of performing a film forming process without loading a semiconductor wafer into the chamber 1. By such pre-coating, the conditions under which a film is formed on a first and then subsequent wafer or wafers can be set in substantially the same way. And it is possible to achieve a stable film forming process with less and less particle build-up.

Figure 4:
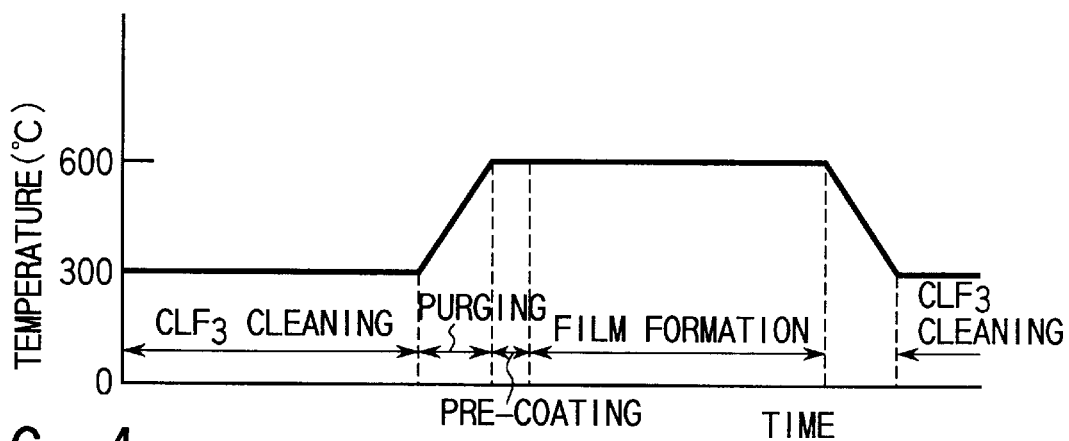
FIG. 4 is a timing chart showing the steps of forming a film by the CVD film forming method according to the aspect of the present invention.
Figure 5:
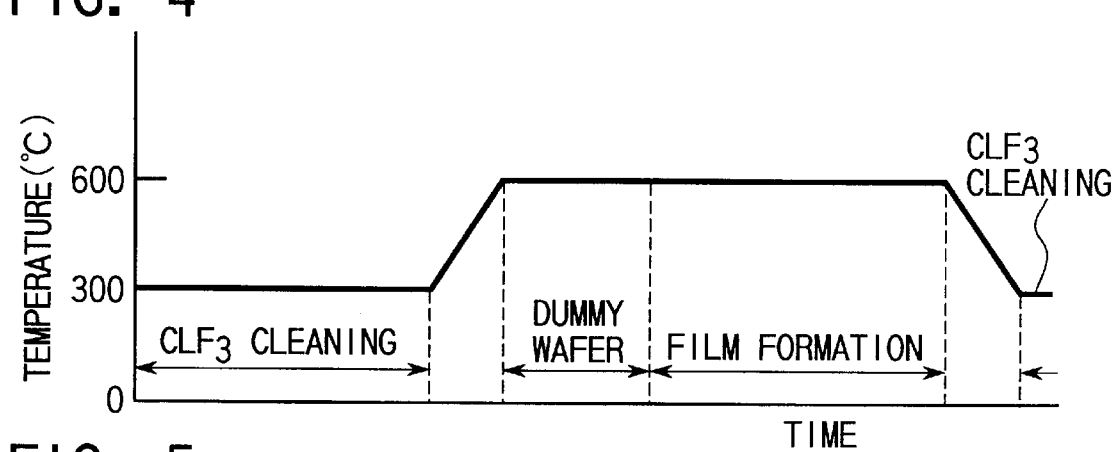
FIG. 5 is a timing chart showing the steps of forming a film in accordance with a conventional CVD method.

FIG. 4 is a timing chart showing a process including a cleaning step and film forming step as set out above. FIG. 5 shows a timing chart of the conventional process for comparison. According to the present embodiment, as shown in FIG. 4, the $N_2$ gas is fed as a purging gas into the chamber 1 during a heat-up process of the susceptor 2, that is, the purging of the cleaning residue is effected through the effective utilization of the heat-up time of the susceptor 2. As a result, it is possible to eliminate the need to perform a process of forming a film on a dummy wafer as having heretofore been performed in the prior art technique (see FIG. 5) and to shorten the processing time by that extent and hence to improve the throughput. In this connection it is to be noted that, since the pre-coating step has only to be performed for a shorter period of time, so short as compared with the time in which a film is formed on the dummy wafer, as heretofore done in the prior art technique, and does not ruin an improved throughput effect even if it is added to the film forming process.

Figure 6:
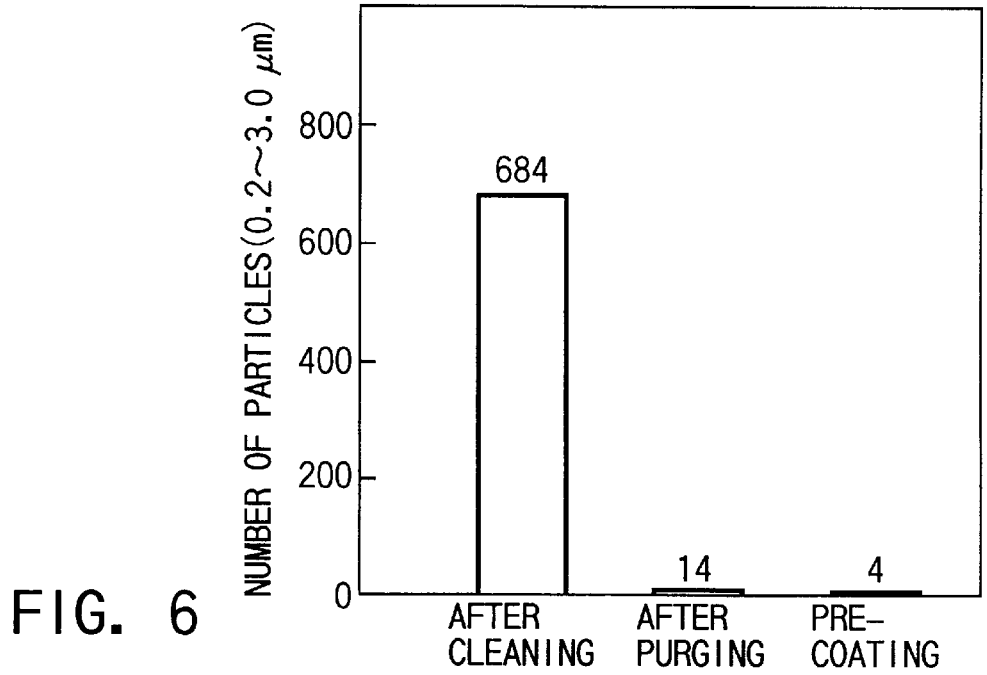
FIG. 6 shows a result of measurement made on the number of particles deposited after the respective steps of a CVD film forming process according to the aspect of the present invention.

FIG. 6 shows a result of measuring on the number of particles involved in the respective steps of the process of the present invention. In this case, the measurements were made to see how many particles were deposited in a circular area of 0.2 to 3.0 $\mu$m in diameter on the surface of a 6-inch wafer W. As shown in FIG. 6, 684 particles were found to be present in that wafer area after cleaning with the $ClF_3$ gas, while, on the other hand, the number of particles deposited was largely decreased down to 14 after purging. When pre-coating was effected, their number was further decreased down to only four. According to the process of the present invention, those particles deposited as a cleaning residue were able to be markedly decreased and it is, therefore, possible to perform a film forming process without the need to use any dummy wafer.

According to the present invention, as set out above, the inside of the chamber 1 is dry-cleaned after a film formation process and, during a heat-up step in preparation for the next film formation process, the insides of the pipe and chamber 1 are purged with an inert gas, so that the cleaning residue deposited in the chamber 1 can be quickly evacuated from the chamber 1. By doing so, it is possible to eliminate any adverse effect resulting from the deposition of such particles. Since, after the heat-up process, the next film formation process is immediately done without the necessity for performing a film formation process on a dummy wafer, the cost involved can be reduced by an extent corresponding to the cost of the dummy wafer. By doing so it is possible to shorten a time otherwise required for the film formation process on the dummy wafer and to improve the throughput.

Further, according to the present invention, after the purging step, a thin film is formed on the susceptor 2 under the same conditions as those under which the film formation step is done, that is, the pre-coating step is done, and then a film is formed on the semiconductor wafer. Therefore, a film is formed on the first wafer, and then on a subsequent wafer or wafers, under substantially the same conditions. As a result, it is possible to form a film on a semiconductor wafer stably and to further decrease the number of particles involved.

The present invention is not restricted to the above-mentioned embodiments. Various changes or modifications of the present invention can be made without departing from the spirit and scope of the present invention. Although, in the present invention, a TiN film has been explained as being formed on the surface of a semiconductor wafer W, substantially the same process can be applied also to the process for forming a Ti film on the surface of the semiconductor wafer W, noting that, in this case, as a film formation gas use is made of a $TiCl_4$ gas and $H_2$ gas. The present invention can be applied not only to the formation of a TiN film and Ti film but also to that of a CVD thin film. Although, in the present invention, the plasmaless cleaning is made using $ClF_3$ as a cleaning gas, the present invention is not restricted thereto. Plasma cleaning may be made by creating a plasma with the use of an $NF_3$, $C_2F_2$, $SF_6$, etc., gas. Further, mechanical cleaning may be effected without using a gas. If cleaning is effected under a dry environment, any form of cleaning may be made. As the purging gas use may be made of not only an $N_2$ gas but also other proper gases such as He and Ar. Although, in the present embodiment, the semiconductor wafer is used as an object to be processed, the present invention is not restricted thereto.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

We claim:

1. A method for forming a CVD film, comprising the steps of:

loading at least one object to be processed into a processing chamber and positioning the object on a support base in the processing chamber;

after positioning the object in the processing chamber, introducing a process gas from a corresponding gas supply source via a corresponding gas introducing pipe into the processing chamber and forming a film by a chemical vapor deposition method on the object in the processing chamber;

after forming the film on the object, unloading the object from the processing chamber;

after unloading the object from the processing chamber, dry-cleaning an inside of the processing chamber by introducing a cleaning gas via the gas introducing pipe into the processing chamber; and after dry-cleaning the inside of the processing chamber, introducing an inert purging gas via a gas introducing pipe into the chamber to purge those particles deposited as a residue in the gas introducing pipe and inside of the chamber, wherein the gas introducing pipe is of such a type as to lead to a plurality of first discharge holes and of second discharge holes in a postmixing shower head at a ceiling section of the processing chamber, and wherein (a) gas is supplied to the first discharge holes and the second discharge holes via respective routes;

(b) the first discharge holes and the second discharge holes do not communicate with each other in the shower head, and are separately open to the processing space;

(c) when dry cleaning is performed, cleaning gas is discharged from the first discharging holes, and at the same time purging gas is discharged from the second discharging holes.

2. The method according to claim 1, wherein, after purging the particles deposited as a residue in the gas introducing pipe and chamber, at least one object to be processed is loaded into the processing chamber and placed on the support base and, thereafter, the process gas is introduced from the gas supply source via the gas introducing pipe into the processing chamber and a film is formed by the CVD method on the object in the processing chamber.

3. The method according to claim 1, further comprising the step of after effecting the dry-cleaning step, heating the inside of the processing chamber up to a film forming temperature, wherein, in the process of heating the inside of the processing chamber, an inert gas is introduced via the gas introducing pipe into the chamber to purge the particles deposited as a residue in the gas introducing pipe and in the chamber.

4. A method for forming a CVD film, comprising the steps of:

loading at least one object to be processed into a processing chamber and positioning the object on a support base in the processing chamber;

after positioning the object in the processing chamber, introducing a process gas from a corresponding gas supply source via a corresponding gas introducing pipe into the processing chamber and forming a film by a chemical vapor deposition method on the object in the processing chamber;

after forming the film on the object, unloading the object from the processing chamber;

after unloading the object from the processing chamber, dry-cleaning an inside of the processing chamber; and after dry-cleaning the inside of the processing chamber, introducing an inert gas via a corresponding gas introducing pipe into the chamber to purge those particles deposited as a residue in the gas introducing pipe and inside of the chamber, further comprising the step of, after purging the particles deposited as a residue in the gas introducing pipe and in the chamber, forming a film on the support base under the same condition under which the film is formed on the object.

5. The method according to claim 4, wherein, after forming a film on the support base, at least one object to be processed is loaded into the processing chamber and located on the support base and, thereafter, a process gas is introduced via the gas introducing pipe into the processing chamber from the gas supply source and a film is formed by the CVD method on the object in the processing chamber.

6. The method according to claim 1, wherein, in the film forming process, a Ti film or TiN film is formed on the object.

7. The method according to claim 6, wherein the cleaning gas is composed of a $ClF_3$ gas.

8. A method for forming a CVD film, comprising the steps of:

loading at least one object to be processed into a processing chamber and positioning the object on a support base in the processing chamber;

after positioning the object in the processing chamber, introducing the processing gas via a gas introducing pipe into the processing chamber from a corresponding gas supply source and forming a Ti film or TiN film by a chemical vapor deposition method on the object in the processing chamber;

after forming such a film, unloading the object form the processing chamber;

after unloading the object from the processing chamber, feeding a $ClF_3$ via a gas introducing pipe into the processing chamber and dry-cleaning an inside of the processing chamber;

after the dry-cleaning step, introducing an inert gas via the gas introducing pipe into the chamber and purging particles deposited as a residue in the gas introducing pipe and in the chamber; and after the purging step, forming a Ti film or TiN film on the support base.

9. A method for forming a CVD film, comprising the steps of:

loading at least one object to be processed in a processing chamber and positioning the object on a support base in the processing chamber;

after the positioning step, introducing a process gas via a gas introducing pipe into the processing chamber from a corresponding gas supply source and forming a Ti film or TiN film by a chemical vapor deposition method on the object in the processing chamber;

after forming such a film, unloading the object from the processing chamber;

after the unloading step, feeding a $ClF_3$ gas via a corresponding gas introducing pipe into the processing chamber and dry-cleaning an inside of the chamber;

after the dry-cleaning step, heating the inside of the chamber up to a film forming temperature;

during heating step, introducing an inert gas via a gas introducing pipe into the chamber and purging particles deposited as a residue in the gas introducing pipe and in the chamber; and after the purging step, forming a Ti film or TiN film on the support base.

10. The method according to claim 9, wherein the gas introducing pipe is of such a type as to lead to a plurality of first discharge holes and of second discharge holes in a shower head at a ceiling section of the processing chamber to allow a $ClF_3$ gas to be discharged from the first discharge holes and an inert gas to be discharged from the second discharge holes.

11. The method according to claim 9, wherein the gas introducing pipe is of such a type that the pipe leads to a plurality of holes in a shower head at a ceiling section of the processing chamber to allow a ClF$_3$ gas to be discharged from some of those discharge holes and an inert gas to be discharged from the other holes.

12. A method for forming a CVD film, comprising the steps of:

loading at least one object to be processed into a processing chamber and positioning the object on a support base in the processing chamber;

after positioning the object in the processing chamber, introducing a process gas from a corresponding gas supply source via a corresponding gas introducing pipe into the processing chamber and forming a film by a chemical vapor deposition method on the object in the processing chamber;

after forming the film on the object, unloading the object from the processing chamber;

after unloading the object from the processing chamber, dry-cleaning an inside of the processing chamber; and after dry-cleaning the inside of the processing chamber, heating the inside of the processing chamber up to a film forming temperature, wherein, in the process of heating the inside of the processing chamber, an inert gas is introduced via the gas introducing pipe into the chamber to purge the particles deposited as a residue in the gas introducing pipe and inside the chamber.

13. The method according to claim 12, wherein, after purging the particles deposited as a residue in the gas introducing pipe and chamber, at least one object to be processed is loaded into the processing chamber and placed on the support base and, thereafter, the process gas is introduced from the gas supply source via the gas introducing pipe into the processing chamber aid a film is formed by the CVD method on the object in the processing chamber.

14. The method according to claim 12, further comprising the step of, after purging the particles deposited as a residue in the gas introducing pipe and in the chamber, forming a film on the support base under the same condition under which the film is formed on the object.

15. The method according to claim 12, wherein, after forming a film on the support base, at least one object to be processed is loaded into the processing chamber and located on the support base and, thereafter, a process gas is introduced via the gas introducing pipe into the processing chamber from the gas supply source and a film is formed by the CVD method on the object in the processing chamber.

* * * * *